(12) United States Patent
Garakani et al.

(10) Patent No.: US 7,342,902 B2
(45) Date of Patent: Mar. 11, 2008

(54) TWO STAGE LOSS-LESS COMPRESSOR FOR A CLEAR CHANNEL OVER A PACKET NETWORK

(75) Inventors: Mehryar Khalili Garakani, Westlake Village, CA (US); Gavin Li-Min Jin, Santa Barbara, CA (US)

(73) Assignee: Cisco Technology, Inc., San Jose, CA (US)

( * ) Notice: Subject to any disclaimer, the term of this patent is extended or adjusted under 35 U.S.C. 154(b) by 951 days.

(21) Appl. No.: 10/458,829

(22) Filed: Jun. 10, 2003

(65) Prior Publication Data

US 2004/0210668 A1   Oct. 21, 2004

Related U.S. Application Data

(63) Continuation-in-part of application No. 10/414,918, filed on Apr. 15, 2003.

(51) Int. Cl.
*H04Q 7/00* (2006.01)
(52) U.S. Cl. .................... 370/329; 370/395.52
(58) Field of Classification Search ............ 370/338, 370/395.52
See application file for complete search history.

(56) References Cited

U.S. PATENT DOCUMENTS

| | | | |
|---|---|---|---|
| 5,179,378 A * | 1/1993 | Ranganathan et al. | 341/51 |
| 5,838,823 A * | 11/1998 | Ancessi | 382/232 |
| 5,884,269 A | 3/1999 | Cellier et al. | |
| 6,434,168 B1 | 8/2002 | Kari | |
| 2001/0046260 A1 | 11/2001 | Molloy | |
| 2002/0091905 A1 | 7/2002 | Geiger et al. | |
| 2004/0008650 A1 * | 1/2004 | Le et al. | 370/338 |

OTHER PUBLICATIONS

ITU (International Telecommunications Union) ITU-T (Telecommunication Standardization Sector of ITU) Recommendation V.42, Series V: Data Communication Over the Telephone Network, "Error-correcting procedures for DCEs using asynchronous-to-synchronous conversion" (Mar. 2002) (67 pages).
ITU (International Telecommunications Union) ITU-T (Telecommunication Standardization Sector of ITU) Recommendation V.44, Series V: Data Communication Over the Telephone Network, "Data compression procedures" (Nov. 2000) (59 pages).

* cited by examiner

*Primary Examiner*—Creighton Smith
(74) *Attorney, Agent, or Firm*—Marger Johnson & McCollom, PC

(57) ABSTRACT

A two stage compression sub-system for clear channel data. The front stage of the compressing sub-system is an octet based repeat compressor (for example a flag compressor). The second stage is dictionary based compressor (for example Lempel-Ziv (LZ) or Huffmann). Data is compressed using several different techniques, and the technique that provides the best compression is used for each particular packet. For example, each packet can be:
  a) compress through both compression stages.
  b) compress through front stage flag compressor only
  c) compress through back stage dictionary compressor only
  d) not compressed through either stage (for highly incompressible data)

After compression, each packet is provided with a header which specifies the exact method used to compress that packet. At the decoder, the packet header is interrogated to determine how the packet should be de-compressed and the appropriate de-compression is then used.

21 Claims, 3 Drawing Sheets

TWO STAGE LOSS-LESS COMPRESSOR FOR A CLEAR CHANNEL OVER A PACKET NETWORK

RELATED APPLICATIONS

The present application is a continuation-in-part of the following applications.
1) application Ser. No. 10/414,918 filed Apr. 15, 2003 entitled: "Multi-Epoch Codebook Learning In A Lossy Packet Network", inventor: Mehryar Garakani.
2) application Ser. No. 10/449,953 filed May 30, 2003 entitled: "Compression of Flags in Full Bandwidth Channels" inventors: Mehryar K. Garakani, Herbert M. Wildfeuer, Prasad Miriyala, and Henry Diep.

Priority under 35 U.S.C. 120 is claimed to the above prior applications. The specifications and drawings of the above applications are hereby incorporated herein by reference.

FIELD OF THE INVENTION

The present invention relates to communication networks and more particularly to compression techniques for use in a communication network.

BACKGROUND OF THE INVENTION

Compression techniques are widely used in communication networks in order to reduce the size of data files and packets, and to thereby increase the amount of data that can be transmitted over a communication link with a particular bandwidth. Alternatively, the bandwidth that would otherwise be used to transmit the uncompressed data can be used to transmit other data.

There are many different types of compression techniques. In data transmission networks that use error corrected reliable channels, codebook or dictionary compression is often used. Examples of loss-less dictionary type of compression include the techniques known as Lempel-Ziv (LZ) coding and the technique known as Huffmann coding. Dictionary methods provide effective mechanisms for generic compression of data streams over a reliable channel. A reliable channel ensures no loss of data between a transmitter and a receiver. For example, in modem communication Lempel-Ziv based algorithms such as ITU (International Telecommunications Union) Recommendation V.44 and V.42 are often used over a reliable link layer. The reliable link is required to ensure that the compressor or encoder and the de-compressor or decoder remain in synchronization.

Another widely used simple type of compression can be termed "flag compression", or "identical octet" compression. In this type of compression, a series of identical octets are replaced by transmitting information that identifies the octet and which indicates the length of the series. Thus, instead of transmitting a series of 25 flag octets a information would be transmitted indicating that there is a series of 25 flag octets. Herein this type of compression is termed "flag compression"; however, it should be understood that it can be applied to any series of identical octets.

The term "clear channel" as used herein means a loss-less communication channel which transmits a series of information bits over a packet network. The important point is that a clear-channel is a "bit oriented" communication channel. The packet network maybe lossy, but the user expects the output stream of bits to closely correspond to the input stream of bits. The transmitted bits can be a series of HDLC like packets, such as X.25, Frame relay, ISDN, SS7 etc, or the bits may have some other structure. Alternatively, a clear channel may merely provide a generic, constant bit rate, data pipe for an arbitrary application.

Dictionary based compression techniques such as Lempel-Ziv (LZ) coding or Huffmann coding can be used to increase the capacity of a clear channel. However, dictionary based techniques have certain deficiencies. (a) The compressor and de-compressor must be kept in synchronization. This means that loss of a packet means loss of synchronization between the compressor and the de-compressor. For subsequent data compression to occur, the compressor and the de-compressor must be synchronized and this can result in the loss of data in the interim period.

The present invention provides an efficient data compression technique for use with a clear channel which may be carrying a variety of different types of information, some of which can be compressed and some of which can not be compressed.

SUMMARY OF THE INVENTION

The present invention provides a two stage compression sub-system for clear channel data. The front stage of the compressing sub-system is an octet based repeat compressor (for example a flag compressor). The second stage is dictionary based compressor (for example Lempel-Ziv (LZ) or Huffmann).

Data is compressed using several different techniques, and the technique that provides the best compression is used for each particular packet. For example, each packet can be:
 a) compress through both compression stages.
 b) compress through front stage flag compressor only
 c) compress through back stage dictionary compressor only
 d) not compressed through either stage (for highly incompressible data)

After compression, each packet is provided with a header which specifies the exact method used to compress that packet. At the decoder, the packet header is interrogated to determine how the packet should be de-compressed and the appropriate de-compression is then used.

DESCRIPTION OF PREFERRED EMBODIMENTS

Figure 1:
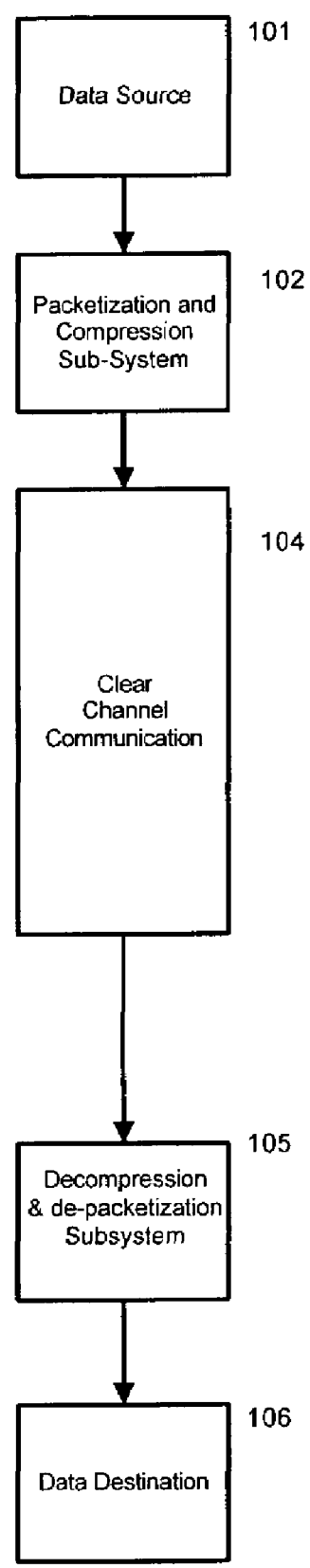
FIG. 1 is an overall block diagram of a first embodiment of the invention.

A first preferred embodiment of the invention is illustrated in FIG. 1. The system accepts a series or stream of bits, applies compression to the data stream, transmits the compressed data through a clear channel communication link, and then de-compresses the data to re-create the original data. At the front end of the system the stream of data bits is divided into octets and multiple octets are compressed and formed into packets with a header.

It is possible to use either fixed length or variable length packets. With fixed length packets, the amount of compression is determined by the number of octets that can be compressed into one packet. With variable length packets, the amount of compression is determined by the length of a packet that results from compressing a fixed number of octets.

The first embodiment described herein utilizes fixed length packets. A second embodiment will be described later which uses variable length packets.

As shown in FIG. 1 a data source 101 provides data to the compression sub-system 102. The compression sub-system 102 divides the data into octets. An appropriate (i.e. best) type of compression is applies to each series of packets and the compressed data is formed into packets. A header is attached to each packet indicating the type of compression used for the data in that particular packet. The packet are transmitted through clear channel communication link 104. A de-compression subsystem 105, interrogates the header of each packet to determine the type of compression used for that packet. De-compression system 105 de-compresses each packet using the appropriate type of de-compression and the de-compressed data is then passed to a destination 106.

The compression subsystem 102 includes two compression engines. The first compression engine (herein termed the front stage compressor) is a conventional octet based repeat compressor which detects and compresses any repeated series of the same character. For example if there are twenty flags, the series of flags is compressed into an indication that the flag octet should be repeated twenty times. That is, a series of twenty flags octets could be represented by three octets, (1) An octet with an escape sequence to indicate that the following octets should be handled as compressed data, (2) an octet containing the character which should be repeated and (3) a third octet containing an indication of how many times the character should be repeated. This is conventional run length encoding.

The second compression engine (herein termed the back stage compression engine) is a dictionary based compressor such as a compression engine which uses Lempel-Zieve or Hufman type of dictionary based compression.

Figure 2:
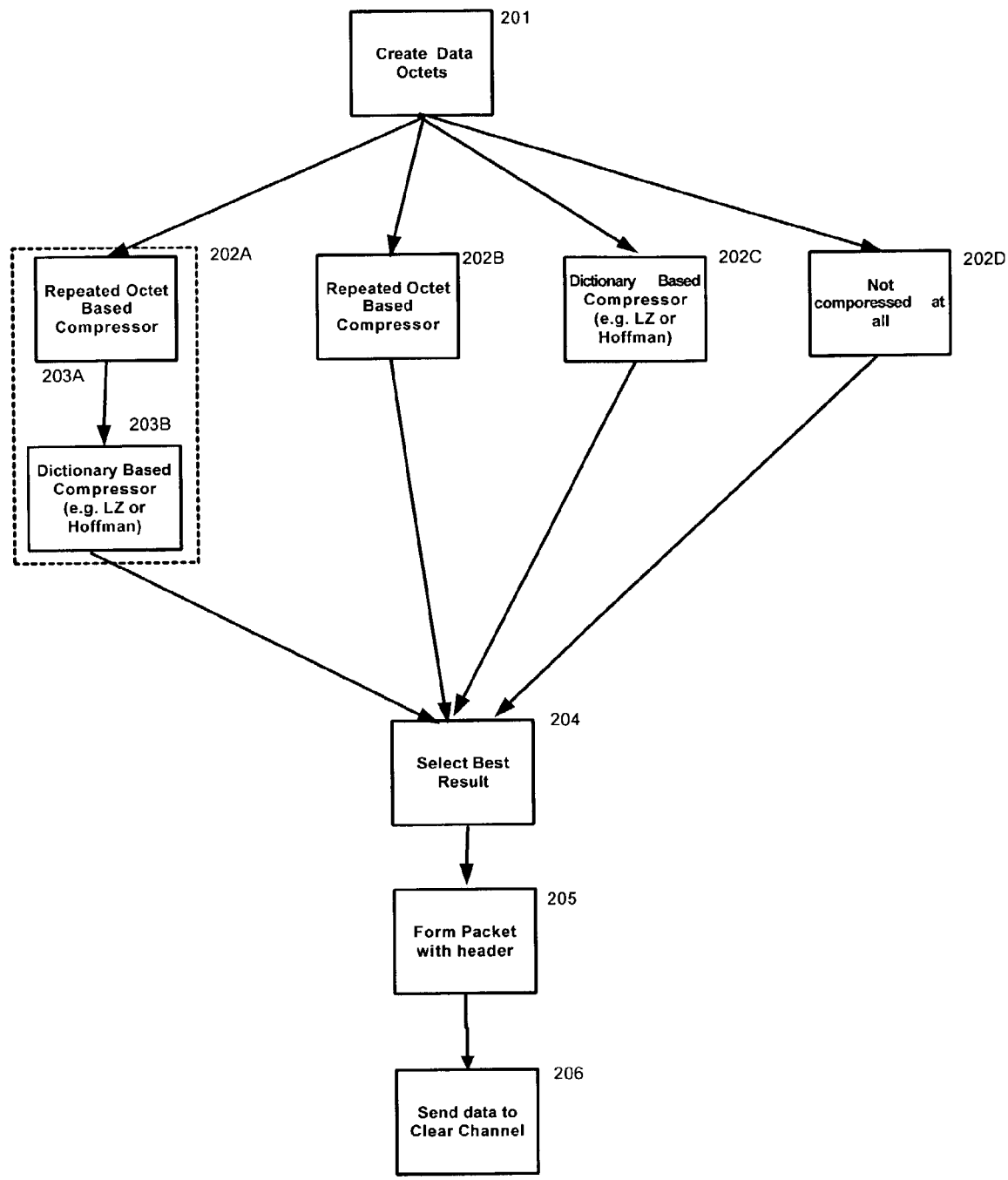
FIG. 2 is a block program flow diagram the compression sub-system shown in FIG. 1.

The compression sub-system operates in accordance with the flow diagram shown in FIG. 2. First as indicated by block 201, the system divides the bit stream into octets of data. Next four operations take place as indicated by blocks 202A, 202B, 202C and 202D. The four operations are as follows:

Block 202A compress data through both compression stages 203A and 203B, that is, first compress through the front stage flag compressor 203A and them compress the output of that compressor through the dictionary compressor 203B.

Block 202B compress data through front stage flag compressor only.

Block 202C compress data through back stage dictionary compressor only.

Block 202D do not compressed through either stage.

In the first embodiment data is compressed into fixed length packets. The amount of compression which can be achieved with a particular series of packets determines how many octets are compressed into one particular packet. For example the packet size might be 80 bytes long and it might be possible to compress 120 octets one such packet. In other situations it may only be possible to compress 90 octets into one packet.

After the octets are compressed using each of the four techniques described above, the compression method which achieved the best compression is determined and that method is used for the particular data. That is, the best compression result is selected as indicated by block 204.

A packet is then formed as indicated by block 205 which has a header indicating what type of compression was used and the data is transmitted via the clear channel 205.

With the first embodiment, the largest number of octets possible are compressed into a fixed length packet. Once a particular series of octets are compressed into a packet, compression of the next series of octets begins and the process is repeated. A second embodiment will be described later which uses variable length packets.

It is noted that while herein, only the packet header information which indicates compression type is discussed. It should however be noted that the packet header can contain other information.

Figure 3:
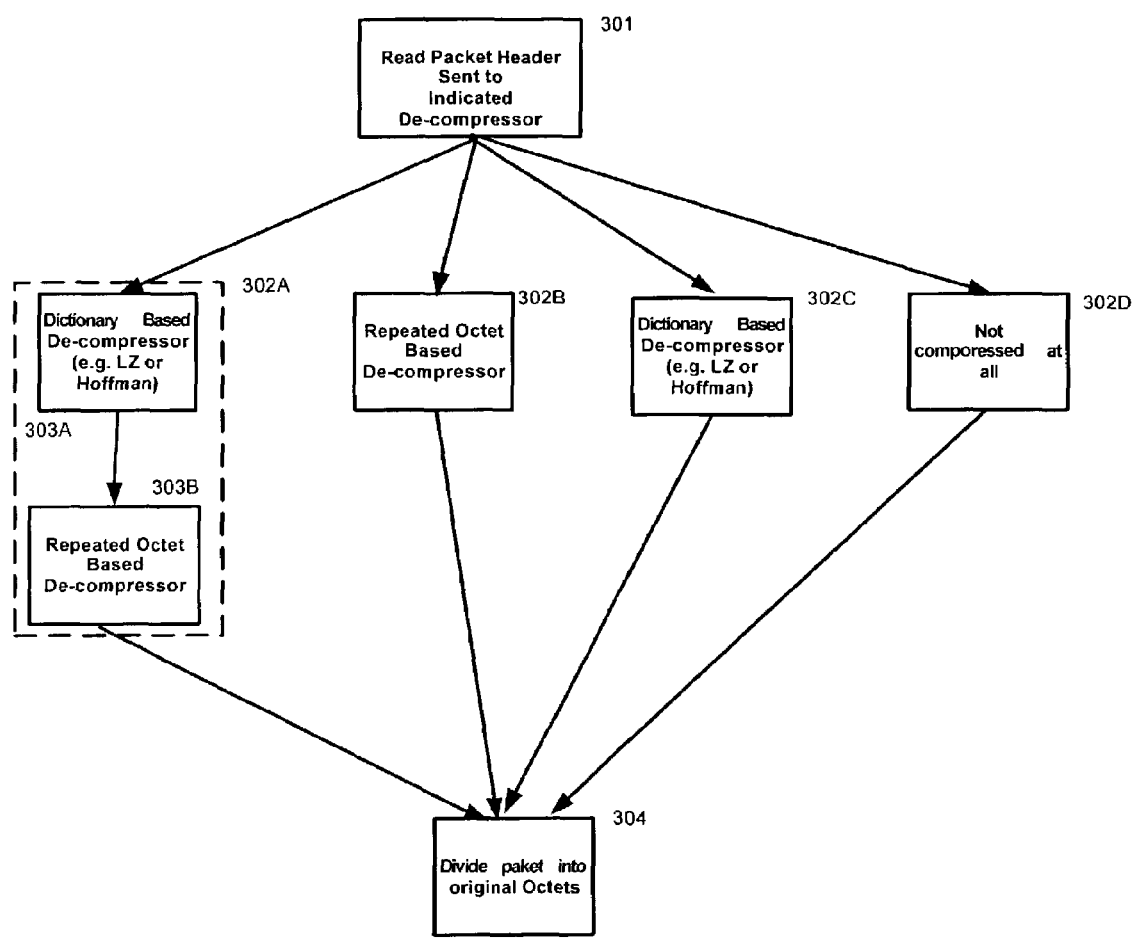
FIG. 3 is a block program flow diagram of the de-compression sub-system shown in FIG. 1.

The operations which take place at the output of the clear channel are shown in FIG. 3. When a packet is received, the header is interrogated as indicated by block 301 to determine the type of compression used for that particular packet. Depending on the information in the header, the data is de-compressed using either process 302A, 302B, 302C or 302D. These are the reverse of the compression possibilities. That is, operates 302A, 302B, 302C and 302D are:

Block 302A compress data through both compression stages 303A and 303B, that is, first de-compress through the front stage dictionary de-compressor 303A and them de-compress the output of that de-compressor through the flag compressor 303B.

Block 302B de-compress data through flag de-compressor only.

Block 302C de-compress data through dictionary de-compressor only.

Block 302D do not de-compressed through either stage.

Once the data has been de-compressed, it is divided into octets as indicated by block 304.

The embodiment described above, utilizes fixed length packets. An alternate embodiment utilizes variable length packets. With fixed length packets, the amount of compression is determined by the number of octets that can be compressed into one packet. With variable length packets, the amount of compression is determined by the length of a packet that results from compressing a fixed number of octets.

In the first embodiment, each of the compressors 202A, 202B, 202C and 202D can utilized a different number of octets to form one fixed length packet. As explained, the technique that results in the highest number of octets being compressed into one packet, is used to compress that particular series of octets. In the second embodiment, at the input of the system, octets are divided into groups, each group having a fixed number of octets. Each group of octets is compressed using the four techniques described relative to the first embodiment. The technique which results in the smallest packet is then used to compress that particular group of octets.

It is noted that the actual compression engines, that is, the front stage octet based repeat compressor and the second stage dictionary compressor are well known and they are implemented as described in the available literature. The blocks shown could be either programming modules which are executed by one or more processors, or they could be special purpose hardware devices.

While the embodiments shown above use two stages of compression, other embodiments could use more stages of compression. Various compression techniques could be used and the technique which provides the greatest compression selected for each packet. In still other embodiments, the selection could be made over more than one packet.

A used herein, the term "compression technique" includes use of data without any compression applied. That is, a decision to use data as it originally appears is herein termed selecting a compression technique. For highly incompressible data, applying no compression algorithm to the data can in some cases result in more compressed data than if various compression algorithms are applied to the data.

While the invention has been shown and described with respect to various embodiments thereof, it should be understood that various changes in form and detail can be made in the implementation of the invention without departing from the spirit and scope of the invention. The scope of the invention is limited only by the appended claims.

We claimed:

1. A system for transmitting data on a clear channel comprising,
   a run length compression engine,
   a dictionary based compression engine,
   data entering said system being compressed into packets in four ways,
      compressed by said run length compression engine and then by said dictionary based compression engine,
      compressed by said run length compression engine only,
      compressed by said dictionary based compression engine only,
      not compressed by either compression engine,
   the way resulting in the highest compression being selected for each packet, and a header indicating the compression technique used for each particular packet being affixed to each particular packet.

2. A method for transmitting data comprising,
   compressing said data using run length compression and dictionary based compression and forming said data into packets in four ways,
      a) by said run length compression and then by said dictionary based compression,
      b) by said run length compression only,
      c) by dictionary based compression only,
      d) by no compression,
   selecting the for each particular packet,"a","b","c" or "d" which results highest level of compression,
   affixing a header to each particular packet indicating how the data in that particular packet was compressed.

3. A method of compressing a data stream comprising,
   compressing and forming packets from said data stream utilizing a plurality of compression techniques,
   selecting for each packet, the compression technique that results in the highest amount of compression,
   attaching a header to each packet which indicates the type of compression used for the data in that particular packet.

4. A system for transmitting data comprising,
   first compression means for run length compressing data,
   second compression means for compressing data using dictionary based compression,
   data entering said system being compressed and formed into packet in four ways,
      compressed by said first compression means and then by said second compression means and formed into packets,
      compressed by said first compression means only and formed into packets,
      compressed by said second compression means only and formed into packets,
      not compressed by either of said compression means and formed into packets,
   the technique resulting in the highest compression being selected for each packet, and a header indicating the compression technique used for that packet being affixed to each packet.

5. A method for transmitting data comprising,
   compressing said data and forming it into packets using a plurality of compression techniques,
   for each packet, selecting compression technique that results in the highest amount of compression,
   affixing a header to each packet which indicates the technique used to compress the data in said packet,
   transmitting said packets of data,
   receiving said packets and interrogating the header of each packet to determine how the data in said packet was compressed,
   de-compressing the data in each particular packet using the technique indicated in the header of said particular packet.

6. The method recited in claim 5 wherein said compression comprises:
   run length compression followed by said dictionary based compression,
   run length compression only,
   dictionary based compression only,
   no compression,
the technique resulting in the highest amount of compression being used for each particular packet.

7. The technique recited in claim 5 wherein said packets are fixed length packets.

8. The technique recited in claim 5 wherein said packets are fixed length packets.

9. The technique recited in claim 6 wherein said packets are variable length packets.

10. The technique recited in claim 6 wherein said packets are fixed length packets.

11. A method of forming packets containing data which includes the steps of:
    compressing said data using a plurality of different compression techniques,
    selecting for each packet the compression technique that resulted in the highest amount of compression,
    adding data to the header of each particular packet which indicates the compression technique used for that particular packet.

12. The method recited in claim 11 wherein said data is compressed by:
    run length compression followed by said dictionary based compression,
    run length compression only,
    dictionary based compression only.

13. A system for forming packets containing data which includes:
    means for compressing said data using a plurality of different compression techniques,
    means for selecting for each packet the technique that results in the highest amount of compression,
    means for adding data to the header of each particular packet which indicates the compression technique used for that particular packet.

14. The system recited in claim 13 wherein said means for compressing data includes
    means for run length compression and means for dictionary based compression.

15. The system recited in claim 14 wherein said selection means selects between, run length compression followed by said dictionary based compression,
run length compression only,
dictionary based compression only,
no compression.

16. A method of transmitting data including the steps of:
compressing said data using a plurality of different compression techniques,
selecting for each packet the compression technique that results in the highest amount of compression,
adding data to the header of each particular packet which indicates the compression technique used for that particular packet,
transmitting said packets to a remote location,
interrogating the header of each particular packet to determine the compression technique used for that particular packet, and
decompressing the data in each particular packet in accordance with the information determined by interrogating the header of the particular packet.

17. A system for transmitting data including:
means for compressing said data using a plurality of different compression techniques,
means for selecting for each packet the compression technique that results in the highest amount of compression,
means for adding data to the header of each particular packet which indicates the compression technique used for that particular packet,
means for transmitting said packets to a remote location,
means for interrogating the header of each particular packet to determine the compression technique used for that particular packet, and
means for decompressing the data in each particular packet in accordance with the information determined by interrogating the header of the particular packet.

18. A computer readable medium having stored thereon sequences of instructions for,
compressing said data and forming it into packets using a plurality of compression techniques,
for each packet, selecting compression technique that results in the highest amount of compression,
affixing a header to each packet which indicates the technique used to compress the data in said packet,
transmitting said packets of data,
receiving said packets and interrogating the header of each packet to determine how the data in said packet was compressed,
de-compressing the data in each particular packet using the technique indicated in the header of said particular packet.

19. The computer readable medium recited in claim 18 including sequences of instructions for:
run length compression followed by said dictionary based compression,
run length compression only,
dictionary based compression only,
no compression,
the technique resulting in the highest amount of compression being used for each particular packet.

20. The computer readable medium recited in claim 19 wherein said packets are fixed length packets.

21. The computer readable medium recited in claim 19 wherein said packets are variable length packets.

* * * * *